(12) United States Patent
Chen et al.

(10) Patent No.: US 8,072,280 B2
(45) Date of Patent: Dec. 6, 2011

(54) VOLTAGE-CONTROLLED OSCILLATOR

(75) Inventors: Wei-Zen Chen, Zhubei (TW);
Chung-Yu Wu, Hsinchu (TW); Chi-Yao Yu, Jhubei (TW)

(73) Assignee: National Chiao Tung University, Hsinchu (TW)

( * ) Notice: Subject to any disclaimer, the term of this patent is extended or adjusted under 35 U.S.C. 154(b) by 32 days.

(21) Appl. No.: 12/552,509

(22) Filed: Sep. 2, 2009

(65) Prior Publication Data
US 2010/0060370 A1 Mar. 11, 2010

(30) Foreign Application Priority Data
Sep. 5, 2008 (TW) .............................. 97134324 A

(51) Int. Cl.
*H03B 5/08* (2006.01)

(52) U.S. Cl. .......... 331/167; 331/16; 331/34; 331/117 R; 331/117 FE

(58) Field of Classification Search ..................... 331/16, 331/177 V, 34, 167, 117 R, 117 FE
See application file for complete search history.

(56) References Cited

U.S. PATENT DOCUMENTS

| | | | |
|---|---|---|---|
| 6,982,605 B2 * | 1/2006 | Mondal et al. | 331/117 R |
| 7,196,592 B2 | 3/2007 | Shi et al. | |
| 7,268,634 B2 | 9/2007 | Luong et al. | |
| 7,375,598 B2 * | 5/2008 | Hung et al. | 331/117 FE |

\* cited by examiner

*Primary Examiner* — Arnold Kinkead
(74) *Attorney, Agent, or Firm* — WPAT, P.C.; Anthony King

(57) ABSTRACT

A voltage-controlled oscillator comprises a variable inductor, a negative impedance circuit, an operating voltage source and a ground point. The variable inductor comprises a transformer and a transistor switch, the transformer comprising a primary side coil and a secondary side coil, the primary side coil comprising a first coil and a second coil, and the secondary side coil comprising a third coil and a fourth coil. The transistor switch is connected in parallel with the primary side coil to adjust an inductance value of the variable inductor based on a gate voltage. The negative impedance circuit is connected in parallel with the secondary side coil to compensate the power consumption of the voltage-controlled oscillator during oscillation. The operating voltage source is electrically connected between the third coil and the fourth coil, and the ground point is electrically connected between the first coil and the second coil.

11 Claims, 9 Drawing Sheets

8,072,280 B2

VOLTAGE-CONTROLLED OSCILLATOR

BACKGROUND OF THE INVENTION (a) Field of the Invention

The present invention relates to a voltage-controlled oscillator, and more particularly to a voltage-controlled oscillator using a variable inductor.

(b) Description of the Prior Art

A voltage-controlled oscillator (VCO) is an electronic oscillation circuit whose oscillation frequency is controlled by the voltage input. Its oscillation frequency varies with different input DC voltages, and it is often applied to such as frequency modulation (FM) circuits, phase modulation (PM) circuits, or pulse width modulation (PWM) circuits, or the like. An LC resonant circuit comprised of a variable capacitance diode C and an inductor L is usually employed to adjust the oscillation frequency of the high-frequency voltage-controlled oscillator. For instance, increasing the reverse bias voltage of the variable capacitance diode enlarges the depletion region in the variable capacitance diode, thereby further increasing the distance between the two conductor faces in the variable capacitance diode and thus reducing the capacitance value. Accordingly, the frequency of the LC resonant circuit will be increased. To the contrary, when the reverse bias voltage is reduced, the capacitance value in the variable capacitance diode increases and the frequency of the LC resonant circuit will be decreased. On the other hand, a low-frequency voltage-controlled oscillator uses different control methods based on different frequency ranges, for example, by controlling the current to change the charging speed for the capacitor.

In a CMOS voltage-controlled oscillator of the prior art, such as a CMOS voltage-controlled oscillator disclosed by U.S. Pat. No. 7,196,592, a variable capacitor is made by connecting a capacitor and a variable resistor in series. However, when the required oscillation frequency is increased to some extent (e.g. 60 GHz), due to the reduction in the quality factor (Q) of the variable capacitor, the maximum variable capacitance value tolerated by the same negative impedance circuit is significantly reduced, thus narrowing the adjustable frequency range and making the voltage-controlled oscillator not applicable to broadband systems.

When a higher frequency resolution is required, in a voltage-controlled oscillator using a variable inductor of the prior art, such as a CMOS voltage-controlled oscillator disclosed by U.S. Pat. No. 7,268,634, numerous CMOS switch/capacitor pairs must be employed as its teaching. These CMOS switch/capacitor pairs that need to be fully switched on and off inherently possess a considerable parasitic capacitance, area and a complicated layout, so its oscillation frequency will be limited by the non-ideal effects.

SUMMARY OF THE INVENTION

In view of the above problems of the prior art, an objective of the present invention is to provide a voltage-controlled oscillator using a variable inductor to solve the problems of the reduced adjustment range and the excessive parasitic capacitance of a voltage-controlled oscillator of the prior art at high frequencies.

According to the objective of the present invention, a voltage-controlled oscillator is provided, which comprises a variable inductor, a negative impedance circuit, an operating voltage source and a ground point. The variable inductor comprises a transformer and a transistor switch. The transformer comprises a primary side coil and a secondary side coil, in which the primary side coil comprises a first coil and a second coil, and the first coil is connected in series with the second coil. The secondary side coil comprises a third coil and a fourth coil, and the third coil is connected in series with the fourth coil. The transistor switch is connected in parallel with the primary side coil to adjust an inductance value of the variable inductor based on a gate voltage. The negative impedance circuit is connected in parallel with the secondary side coil to compensate the power consumption of the voltage-controlled oscillator during oscillation. The operating voltage source is electrically connected between the third coil and the fourth coil, and the ground point is electrically connected between the first coil and the second coil. By doing so, the oscillation frequency of the voltage-controlled oscillator is controlled by the inductance value, and the inductance value is adjusted by the gate voltage value.

As described above, a voltage-controlled oscillator using a variable inductor according to the present invention may have one or more of the following advantages:

(1) The present invention enables a CMOS voltage-controlled oscillator or a digit code-controlled oscillator to have a relatively high oscillation frequency, a broad frequency adjustment range, and a high frequency resolution.

(2) The present invention is based on utilizing a transformer and a variable resistor, requiring no variable capacitors, and only requires a transistor switch that can be fully switched on and off to complete the design of variable inductance. If it is used in a voltage-controlled oscillator or a digit code-controlled oscillator, they can be operated at a relatively high oscillation frequency and frequency resolution, and also have broad frequency adjustment ranges.

(3) The present invention can solve the problem of the narrow frequency adjustment range of a voltage-controlled oscillator at high frequencies, which makes the voltage-controlled oscillator not applicable to broadband systems. For a digit code-controlled oscillator, the present invention can reach a higher oscillation frequency in the same frequency resolution.

DETAILED DESCRIPTION OF THE PREFERRED EMBODIMENTS

Figure 1:
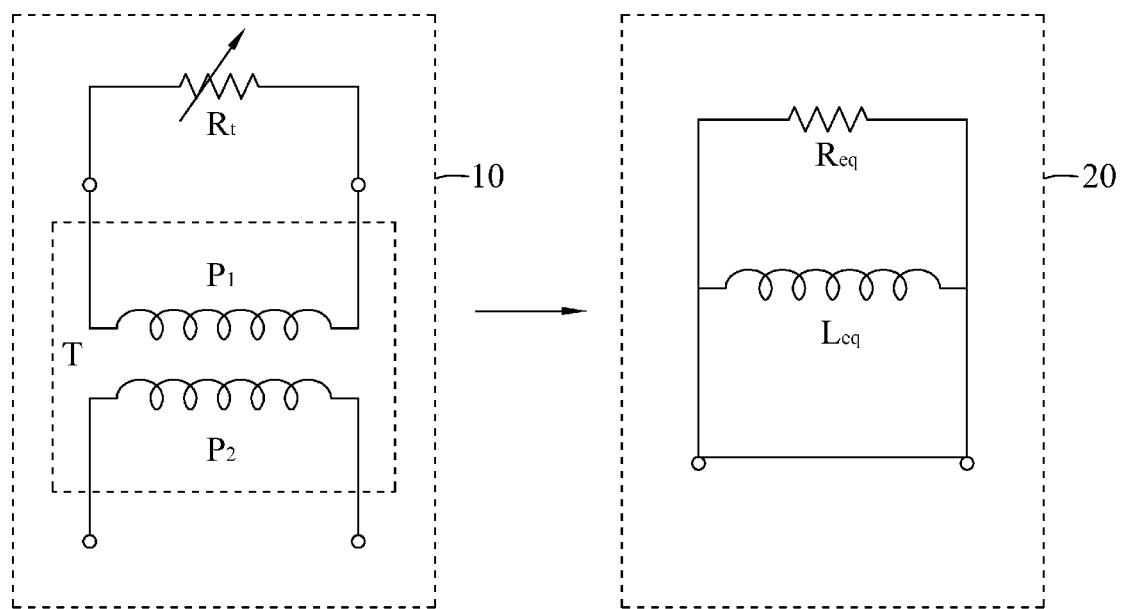
FIG. 1 is a schematic view showing the structure of a variable inductor comprised of a transformer and a variable resistor according to an embodiment of the present invention.

Referring to FIG. 1, there is illustrated a schematic view showing the structure of using a transformer and a variable resistor to serve as a variable inductor according to an embodiment of the present invention. In this drawing, the variable inductor 10 comprises a transformer T and a variable resistor $R_t$, and the transformer T comprises a primary side coil P1 and a secondary side coil P2. As seen from the secondary side coil P2, the variable inductor 10 can be equivalent to an equivalent circuit 20, and its equivalent resistance $R_{eq}$ and equivalent inductance $L_{eq}$ can be calculated as:

$$L_{eq} = \frac{R_t^2 L_1^2 + \omega^2 L_1^2 L_2^2 (1-k^2)^2}{R_t^2 L_1 + \omega^2 L_1 L_2^2 (1-k^2)}$$

$$R_{eq} = \frac{R_t L_1}{k^2 L_2} + \frac{\omega^2 L_1 L_2 (1-k^2)^2}{k^2 R_t}$$

Wherein $\omega$ is a frequency, k is a coupling parameter of the transformer T, $L_1$ is the inductance value of the primary side coil P1, and $L_2$ is the inductance value of the secondary side coil P2.

Figure 2:
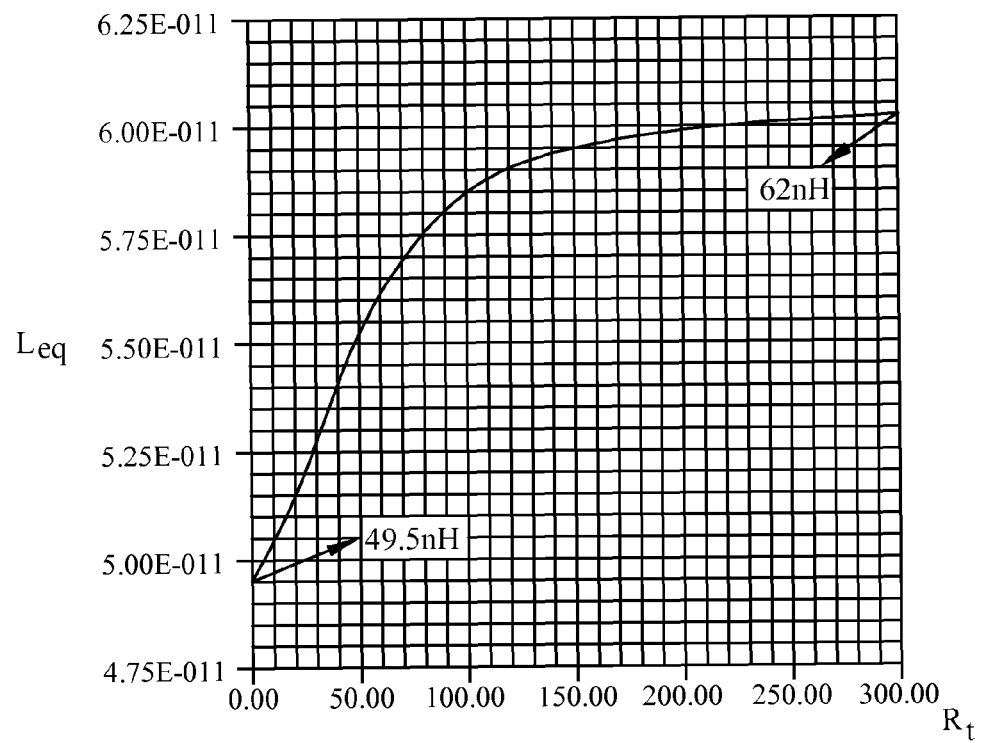
FIG. 2 shows an equivalent inductance-variable resistance curve and a quality factor-variable resistance curve of a according to an embodiment of the present invention.
Figure 2:
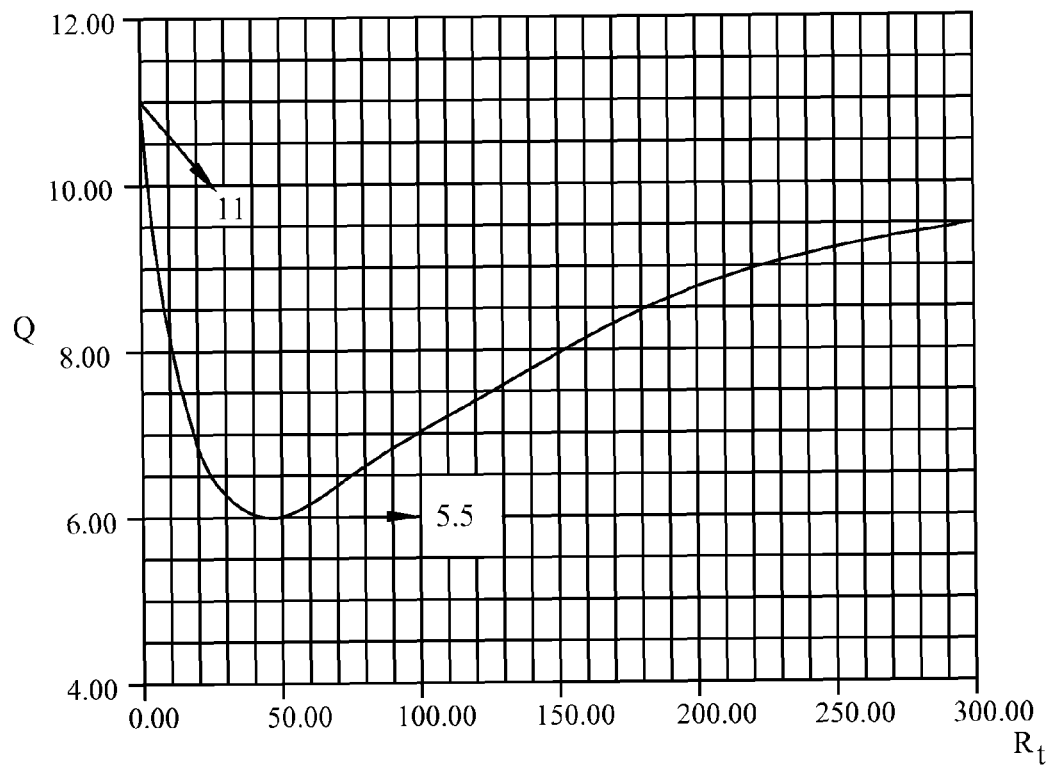

It can be seen from the above equations that the equivalent inductance $L_{eq}$ changes as the variable resistance $R_t$ changes. The equivalent inductance $L_{eq}$ and quality factor $Q=R_{eq}/\omega L_{eq}$ versus the variable resistance $R_t$ curves of the variable inductor 10 at extremely high frequencies are as shown in FIG. 2. It can be seen from FIG. 2 that in this embodiment, the variable inductor 10 has a very stable quality factor Q at high frequencies, particularly at a frequency up to 60 GHz, and the slope of the equivalent inductance $L_{eq}$ to the variable resistance $R_t$ is relatively stable.

Figure 3:
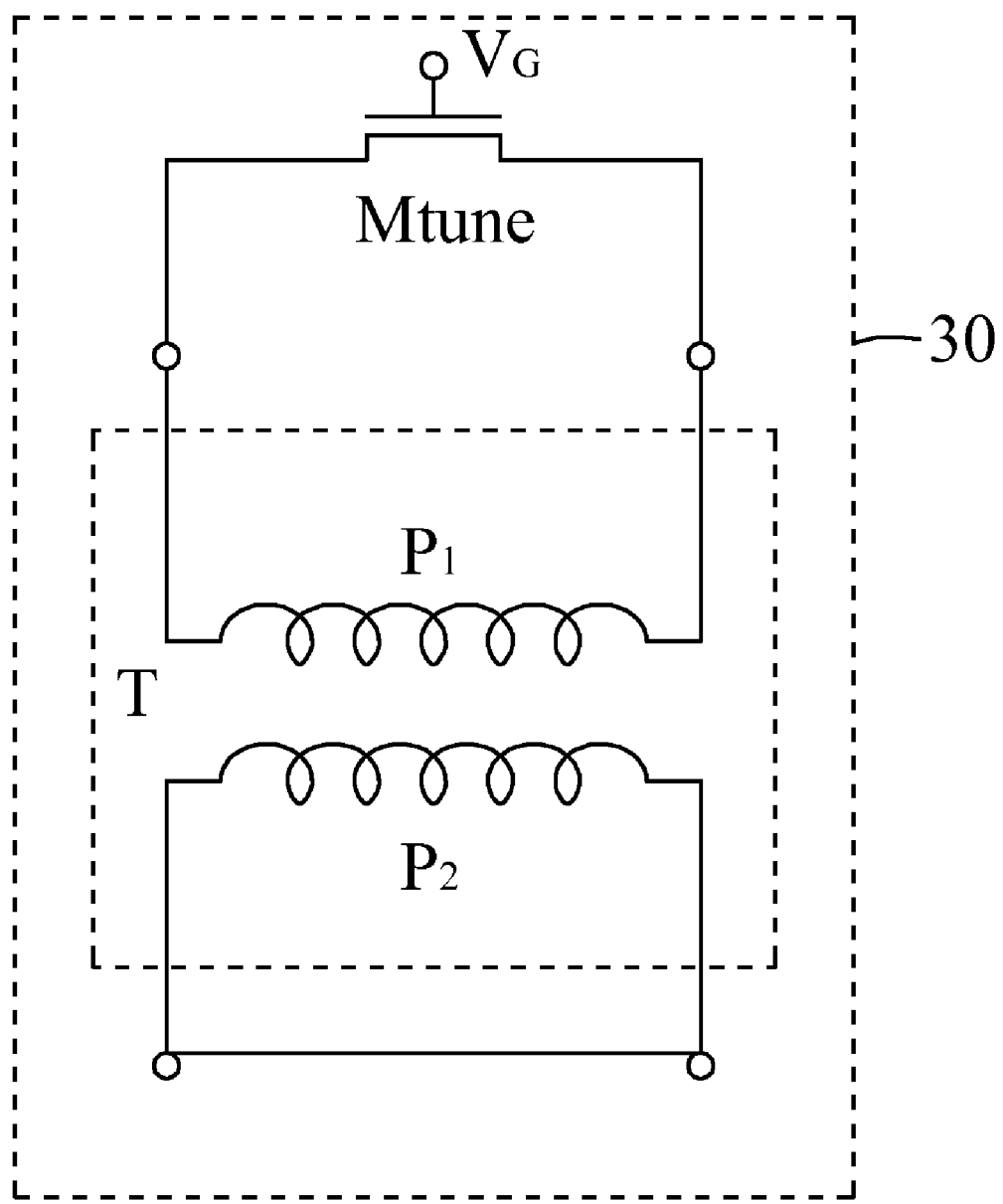
FIG. 3 is a schematic view showing the structure of a variable inductor in which the variable resistor is replaced by a transistor switch according to the present invention.

Referring to FIG. 3, there is illustrated a schematic view showing the structure of a variable inductor in which the variable resistor is replaced by a transistor switch according to the present invention. In the design of a CMOS integrated circuit, the above variable resistor $R_t$ can be realized by using a transistor switch. In this drawing, a transistor switch $M_{tune}$ is connected in parallel with the primary side coil P1 of the transformer T to substitute for the variable resistor $R_t$ in the variable inductor 30, and the purpose of adjusting the resistance value is achieved by a gate voltage $V_G$. By doing so, the variable inductor 30 according to the present invention can be easily incorporated into an integrated circuit manufacturing process, and the precision in regulating the variable resistor $R_t$ is increased through the gate voltage $V_G$.

Figure 4:
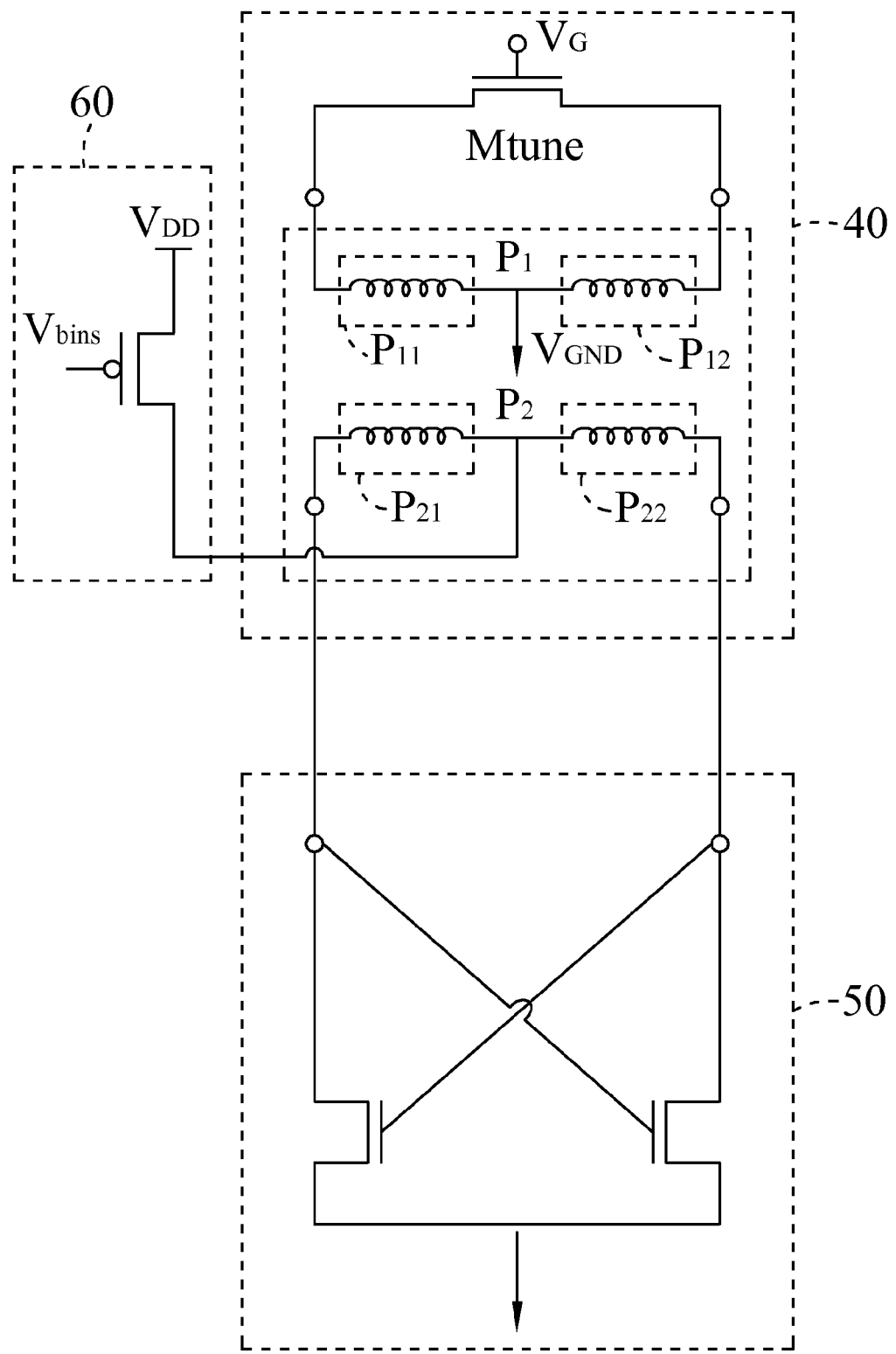
FIG. 4 is a schematic view showing the structure of a voltage-controlled oscillator using a variable inductor according to the present invention.

Next, referring to FIG. 4, there is illustrated a schematic view showing the structure of a voltage-controlled oscillator using a variable inductor according to the present invention. In this drawing, a voltage-controlled oscillator according to the present invention comprises a variable inductor 40, a negative impedance circuit 50, an operating voltage source 60 and a ground point VGND. The operation principle of the variable inductor 40 has been described in details as above so it is not purposed to go into details here. However, it is only disclosed in an embodiment of the present invention as the following: the variable inductor 40 comprises a transformer T and a transistor switch $M_{tune}$, the transformer T comprising a primary side coil P1 and a secondary side coil P2; the primary side coil P1 comprises a first coil P11 and a second coil P12, and the first coil P11 is connected in series with the second coil P12; the secondary side coil P2 comprises a third coil P21 and a fourth coil P22, and the third coil P21 is connected in series with the fourth coil P22. The transistor switch $M_{tune}$ is connected in parallel with the primary side coil P1 to adjust an inductance value of the variable inductor 40 based on a gate voltage $V_G$. Thus, the transistor switch $M_{tune}$ can be an NMOS field effect transistor switch, a PMOS field effect transistor switch, or a CMOS field effect transistor switch The negative impedance circuit 50 of the voltage-controlled oscillator is connected in parallel with the secondary side coil P2 to compensate the power consumption of the voltage-controlled oscillator during oscillation. The structure and operation principle of the negative impedance circuit 50 are known to those skilled in the art so it is not purposed to go into details here. However, there is only provided the negative impedance circuit 50 as an example, but the present invention is not limited thereto. Namely, one of ordinary skill in the art can easily design negative impedance circuits of other structures without interfering with the practice of the invention.

Figure 5:
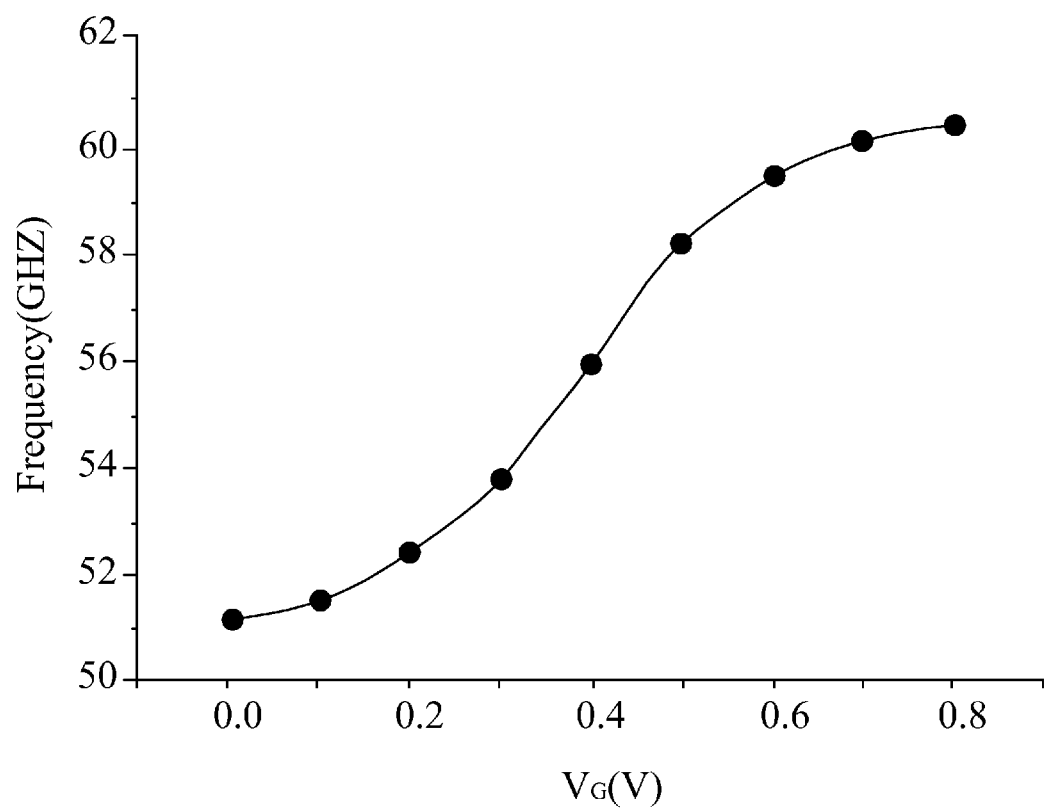
FIG. 5 shows a gate voltage-oscillation frequency curve of a voltage-controlled oscillator according to the present invention.

The operating voltage source 60 is electrically connected between the third coil P21 and the fourth coil P22 to provide the voltage-controlled oscillator with an operating voltage VDD. Moreover, the operating voltage source 60 can be concatenated with an operating bias Vbias to receive voltage signals, such as frequency modulation (FM), phase modulation (PM), or pulse width modulation (PWM), or the like in an embodiment. The ground point VGND is electrically connected between the first coil P11 and the second coil P12. By doing so, the oscillation frequency of the voltage-controlled oscillator is controlled by the inductance value, and the inductance value can be adjusted by the gate voltage value. Namely, the oscillation frequency can be changed as long as the gate voltage $V_G$ is changed. FIG. 5 shows a gate voltage $V_G$-oscillation frequency curve when a 130 nm CMOS is used. It can be seen from the drawing that when the oscillation frequency reaches 60 GHz, the voltage-controlled oscillator still has a frequency adjustment range of 16.63% (51~60 GHz).

Figure 6:
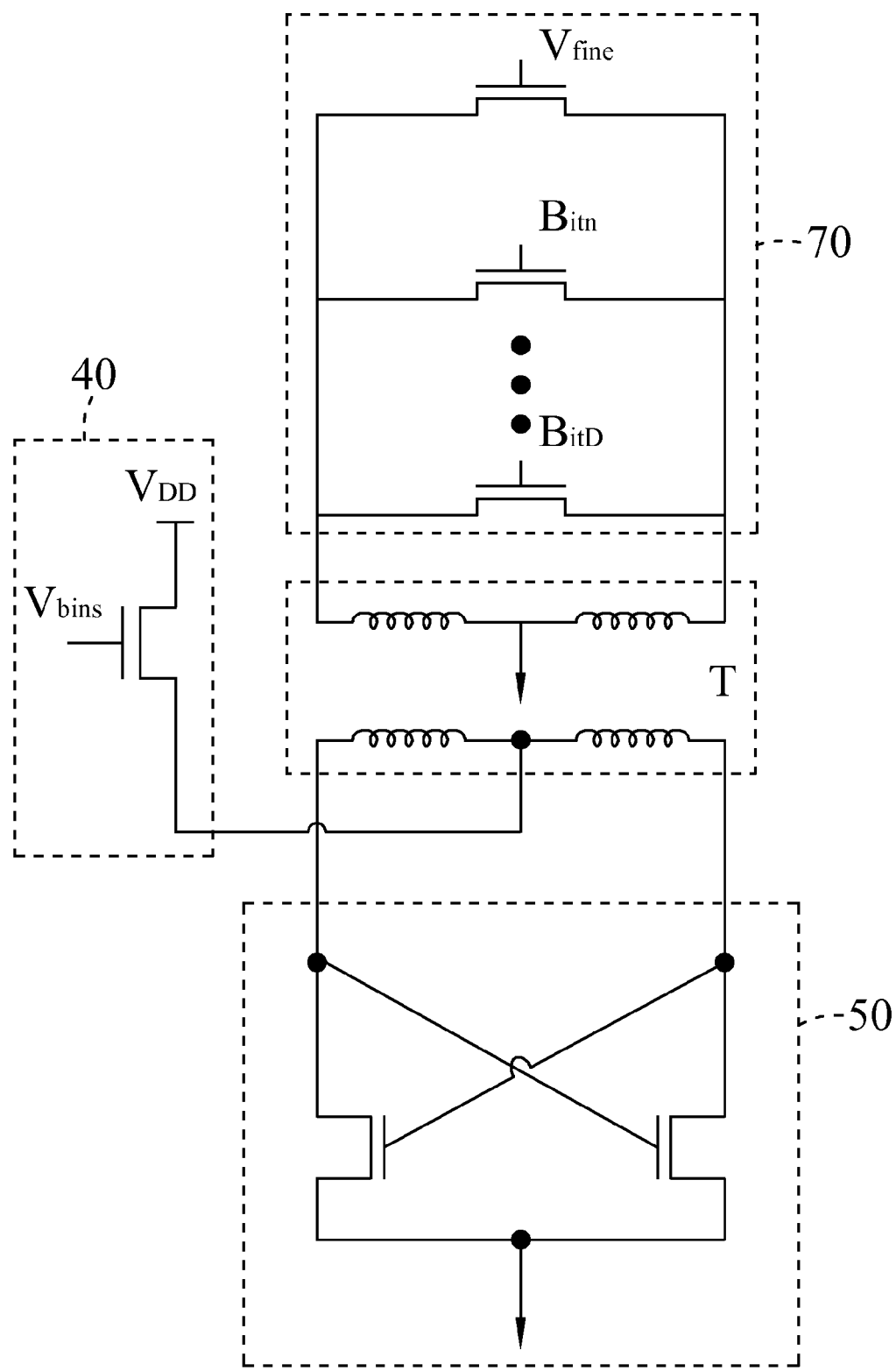
FIG. 6 is a schematic view showing the structure of a voltage-controlled oscillator according to an embodiment of the present invention.
Figure 7:
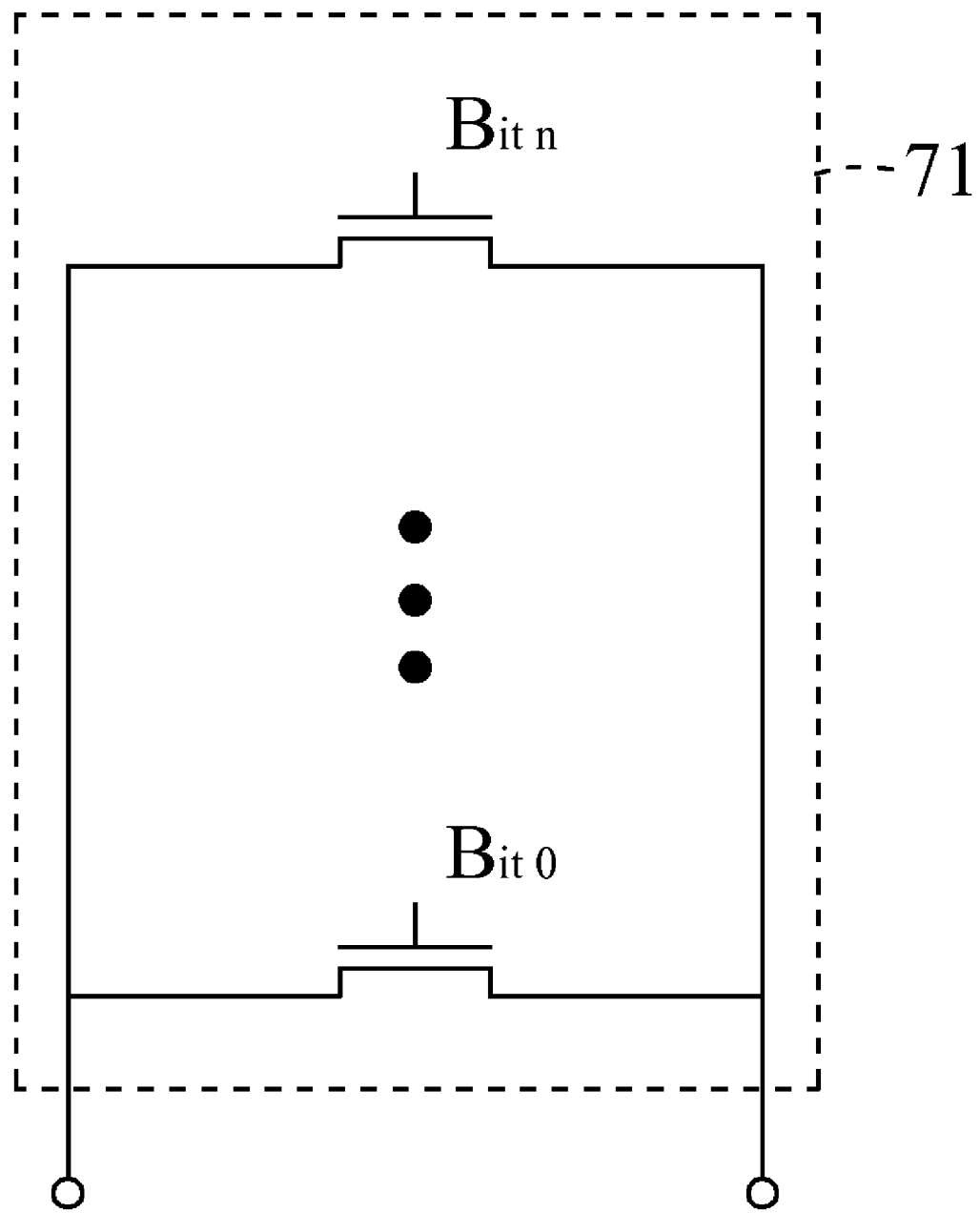
FIG. 7 is a schematic view showing the structure of an array of field effect transistor switches according to an embodiment of the present invention.
Figure 8:
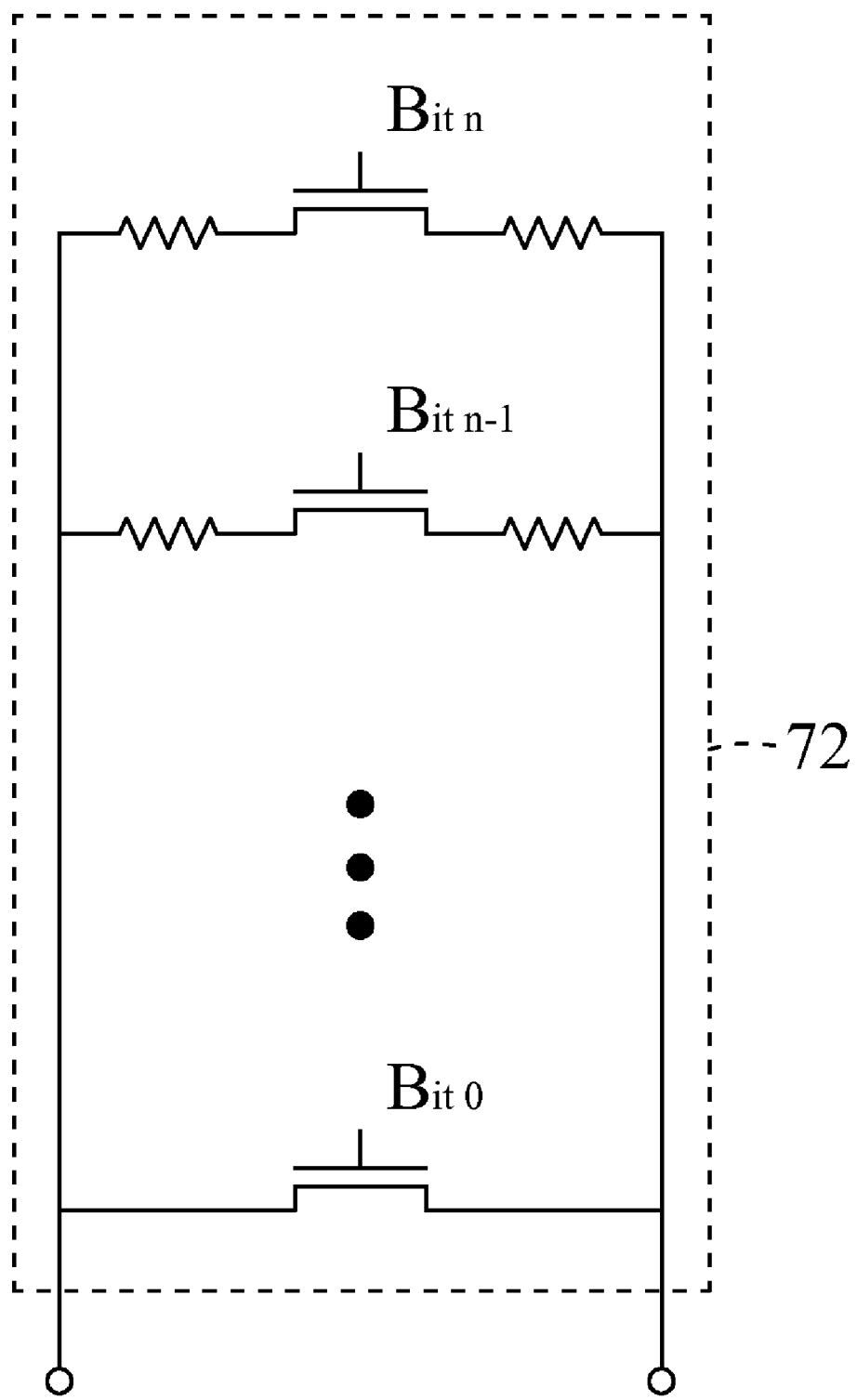
FIG. 8 is a schematic view showing the structure of an array of field effect transistor switches having switch/resistor pairs according to an embodiment of the present invention.

Referring to FIG. 6, there is illustrated a schematic view showing the structure of a voltage-controlled oscillator according to an embodiment of the present invention. In this embodiment, the transistor switch $M_{tune}$ is substituted by an array of field effect transistor switches 70. By doing so, the array of field effect transistor switches 70 enables the voltage-controlled oscillator according to the present invention to have a frequency rough adjustment mechanism and a frequency fine adjustment mechanism. Namely, the array of field effect transistor switches 70 can comprise 1 field effect transistor switch controlled by an analog voltage signal $V_{fine}$ and n+1 field effect transistor switches controlled by digital voltage signals Bit 0~Bit n. These above field effect transistor switches can be connected in parallel with each other to form the above array of field effect transistor switches 70. By doing so, the voltage-controlled oscillator can be roughly adjusted through the digital voltage signals Bit 0~Bit n, and can be finely adjusted through the analog voltage signal $V_{fine}$ in this embodiment. It is to be noted that the array of field effect transistor switches 70 can be achieved by segmenting the transistor switch $M_{tune}$ so there is no increase in the parasitic capacitance. Moreover, when the voltage-controlled oscillator using a variable inductor according to the present invention is applied to a high-frequency and high-resolution digit code-controlled oscillator (DCO), the array of field effect transistor switches 70 can be designed as an array of field effect transistor switches 71 as shown in FIG. 7, and further the digital voltage signals Bit 0~Bit n are fully regulated by a digit code controller. Besides, if it is necessary to increase the frequency resolution, an array of field effect transistor switches 72 having switch/resistor pairs as shown in FIG. 8 can also be used. As described above, the digital voltage signals Bit 0~Bit n are preferably connected to a digital controller using fractional-N control codes to meet the requirement of high frequency and high resolution.

Figure 9:
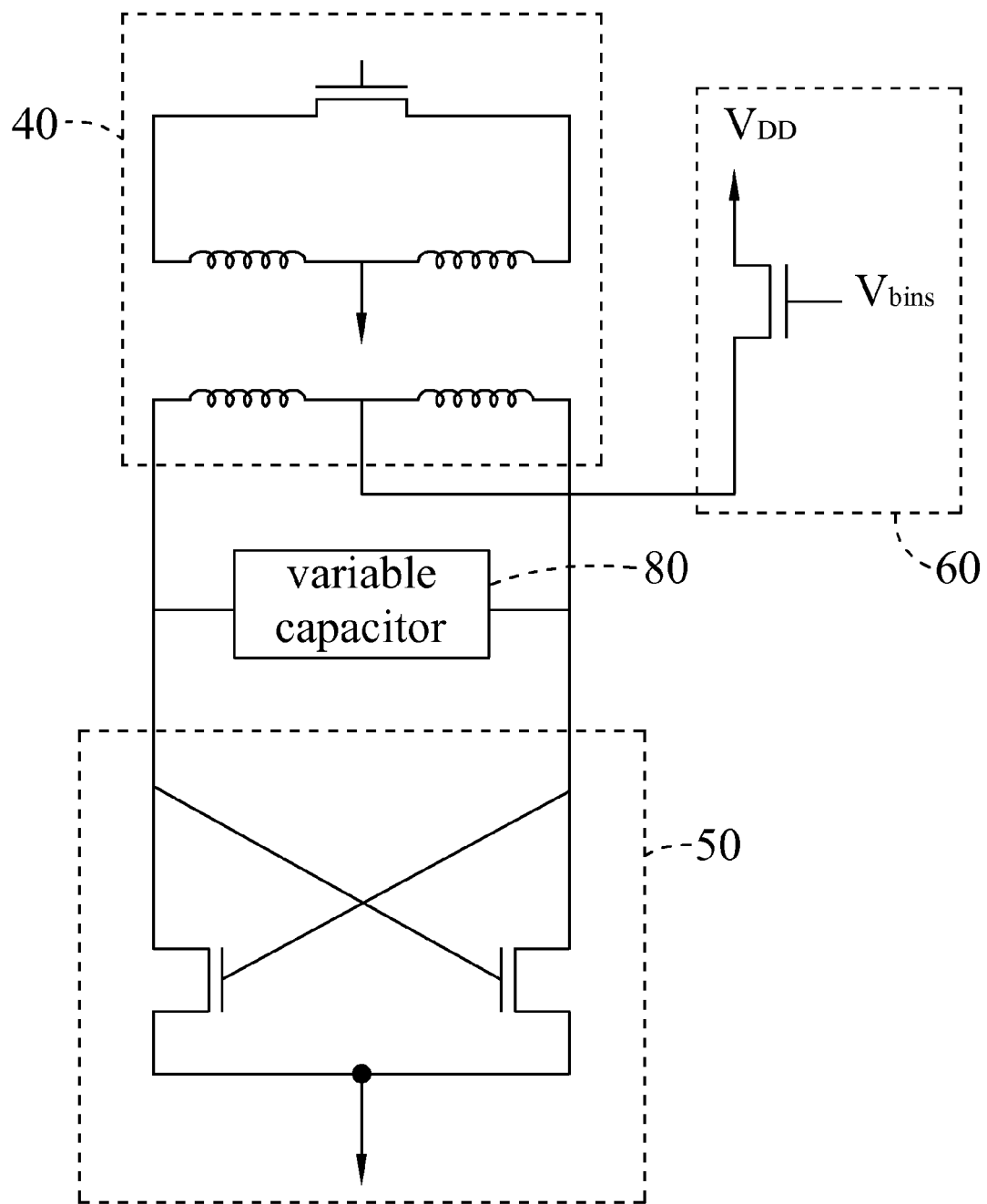
FIG. 9 is a schematic view showing the structure of a voltage-controlled oscillator according to an embodiment of the present invention.

Finally, referring to FIG. 9, there is illustrated a schematic view showing the structure of a voltage-controlled oscillator according to an embodiment of the present invention. In this drawing, the implementation modes of the variable inductor 40, the negative impedance circuit 50, and the operating voltage source 60 have been described in details as above so it is not purposed to go into details here. The voltage-controlled oscillator in this embodiment can further comprise a variable capacitor 80 that is connected in parallel with the secondary side coil P2 to extend a frequency adjustment range of the voltage-controlled oscillator in this embodiment. Moreover, in order to increase the frequency resolution of the voltage-controlled oscillator in this embodiment, the variable capacitor 80 can be realized by using an array an array of switching capacitors.

What is claimed is:

1. A voltage-controlled oscillator comprising:
   a variable inductor comprising:
      a transformer comprising a primary side coil and a secondary side coil, the primary side coil comprising a first coil and a second coil, the first coil being connected in series with a second coil, the secondary side coil comprising a third coil and a fourth coil, the third coil being connected in series with the fourth coil; and
      a transistor switch connected in parallel with the primary side coil to adjust an inductance value of the variable inductor based on a gate voltage;
   a negative impedance circuit connected in parallel with the secondary side coil to compensate power consumption of the voltage-controlled oscillator during oscillation;
   an operating voltage source electrically connected between the third coil and the fourth coil; and
   a ground point electrically connected between the first coil and the second coil;
   wherein the oscillation frequency of the voltage-controlled oscillator is controlled by the inductance value, and the transistor switch is an array of field effect transistor switches.

2. The voltage-controlled oscillator as claimed in claim 1, wherein the array of field effect transistor switches is controlled by a digital controller.

3. The voltage-controlled oscillator as claimed in claim 2, wherein the digital controller is a digital controller using fractional-N control codes.

4. The voltage-controlled oscillator as claimed in claim 1, wherein a part of the field effect transistor switches of the array of field effect transistor switches is used for finely adjusting the frequency.

5. The voltage-controlled oscillator as claimed in claim 4, wherein another part of the field effect transistor switches of the array of field effect transistor switches is used for roughly adjusting the frequency.

6. The voltage-controlled oscillator as claimed in claim 1, wherein the secondary side coil is connected in parallel with a variable capacitor to extend a frequency adjustment range of the voltage-controlled oscillator.

7. The voltage-controlled oscillator as claimed in claim 1, wherein the secondary side coil is connected in parallel with an array of switching capacitors to increase a frequency resolution of the voltage-controlled oscillator.

8. The voltage-controlled oscillator as claimed in claim 1, wherein the operating voltage source is concatenated with an operating bias to receive the voltage signal of frequency modulation (FM), phase modulation (PM), or pulse width modulation (PWM).

9. A voltage-controlled oscillator comprising:
   a variable inductor comprising:
      a transformer comprising a primary side coil and a secondary side coil, the primary side coil comprising a first coil and a second coil, the first coil being connected in series with a second coil, the secondary side coil comprising a third coil and a fourth coil, the third coil being connected in series with the fourth coil; and
      a transistor switch connected in parallel with the primary side coil to adjust an inductance value of the variable inductor based on a gate voltage;
   a negative impedance circuit connected in parallel with the secondary side coil to compensate power consumption of the voltage-controlled oscillator during oscillation;
   an operating voltage source electrically connected between the third coil and the fourth coil, and concatenated with an operating bias to receive the voltage signal of frequency modulation (FM), phase modulation (PM), or pulse width modulation (PWM); and
   a ground point electrically concatenated between the first coil and the second coil;
   wherein the oscillation frequency of the voltage-controlled oscillator is controlled by the inductance value.

10. The voltage-controlled oscillator as claimed in claim 9, wherein the secondary side coil is connected in parallel with a variable capacitor to extend a frequency adjustment range of the voltage-controlled oscillator.

11. The voltage-controlled oscillator as claimed in claim 9, wherein the secondary side coil is connected in parallel with an array of switching capacitors to increase a frequency resolution of the voltage-controlled oscillator.

\* \* \* \* \*